United States Patent
Yasunobe

(10) Patent No.: US 9,081,308 B2
(45) Date of Patent: *Jul. 14, 2015

(54) DRIVING APPARATUS AND EXPOSURE APPARATUS AND DEVICE FABRICATION METHOD

(75) Inventor: Osamu Yasunobe, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 768 days.

This patent is subject to a terminal disclaimer.

(21) Appl. No.: 13/227,180

(22) Filed: Sep. 7, 2011

(65) Prior Publication Data
US 2011/0317145 A1    Dec. 29, 2011

Related U.S. Application Data

(63) Continuation of application No. 12/247,037, filed on Oct. 7, 2008, now Pat. No. 8,035,805.

(30) Foreign Application Priority Data

Oct. 17, 2007  (JP) ................................. 2007-270468
Sep. 9, 2008   (JP) ................................. 2008-231445

(51) Int. Cl.
G03B 27/60    (2006.01)
G03B 27/58    (2006.01)
G03F 7/20     (2006.01)
F16C 29/02    (2006.01)
F16C 32/06    (2006.01)

(52) U.S. Cl.
CPC .......... *G03F 7/70758* (2013.01); *F16C 29/025* (2013.01); *F16C 32/0603* (2013.01); *G03F 7/7095* (2013.01); *G03F 7/70816* (2013.01); *Y10T 74/20354* (2015.01)

(58) Field of Classification Search
CPC .. G03F 7/70758; G03F 7/7095; F16C 29/025
USPC ............. 355/53, 72–76; 310/10, 12; 318/625, 318/628, 649; 378/34, 35
See application file for complete search history.

(56) References Cited

U.S. PATENT DOCUMENTS

| | | |
|---|---|---|
| 5,828,142 A | 10/1998 | Simpson |
| 6,158,298 A | 12/2000 | Hara |
| 6,320,649 B1 * | 11/2001 | Miyajima et al. ............... 355/72 |
| 6,583,859 B2 | 6/2003 | Miyajima et al. |
| 8,035,805 B2 * | 10/2011 | Yasunobe ...................... 355/72 |

* cited by examiner

*Primary Examiner* — Hung Henry Nguyen
(74) *Attorney, Agent, or Firm* — Canon USA, Inc. IP Division

(57) ABSTRACT

A guide includes a brittle material layer and a magnetically attracting magnetic body, e.g., a metal layer. A recess and a projection are formed on the metal layer. The brittle material layer is made of, e.g., a sprayed ceramic material and covers the recess formed on the magnetically attracting metal layer. A movable body moves as it levitates above the surface of the brittle material layer.

7 Claims, 7 Drawing Sheets

DRIVING APPARATUS AND EXPOSURE APPARATUS AND DEVICE FABRICATION METHOD

CROSS-REFERENCE TO RELATED APPLICATIONS

This application claims the benefit of U.S. application Ser. No. 12/247,037 filed Oct. 7, 2008, now U.S. Pat. No. 8,035, 805 issued on Oct. 11, 2011, Japanese Patent Application No. 2007-270468 filed Oct. 17, 2007, and No. 2008-231445 filed Sep. 9, 2008 which are hereby incorporated by reference herein in its entireties.

BACKGROUND OF THE INVENTION

1. Field of the Invention

The present invention relates to a driving apparatus, an exposure apparatus which comprises the same, and a device fabrication method which fabricates a device using the exposure apparatus.

2. Description of the Related Art

An exposure apparatus is used in a lithography process, more particularly an exposure process to fabricate a device such as a semiconductor device. The exposure apparatus is configured to project a pattern on a mask held by a mask stage onto a wafer held by a wafer stage by using a projection optical system, and to expose the wafer.

A stage apparatus is used to hold and position the wafer and mask. The stage apparatus comprises a stage provided with a chuck which holds the wafer and mask, and a driving mechanism which drives the stage. For example, the driving mechanism can include a movable body which moves together with the stage, a guide which supports or guides the movable body, an actuator such as a linear motor which generates a driving force, and the like. The movable body can move while forming an almost constant gap with respect to the guide by a levitation force generated by an air pad and an attracting force generated by a pressurization magnet.

Conventionally, the guide is made of cast iron, and its surface is plated with nickel and phosphorus to prevent surface oxidation and increase the hardness and surface accuracy.

In an air guide mechanism, air may be shut off while the stage moves. Then, the air pad may come into contact with the guide and damage the guide. The guide may also be damaged if the stage moves with small dust or the like being present between the air pad and guide. When the metal material described above is used as the material of the guide, if the guide surface is damaged, the surface of the metal material may undesirably bulge. In this state, when the stage or the like moves along the surfaces of the respective guides, the bulge of the guide may rub against the air pad.

Consequently, the geometric accuracy of motion of the air guide mechanism may be impaired, or the dynamic characteristics of the air guide mechanism may fluctuate to considerably degrade the control performance over the moving stage. If the air guide mechanism is continuously used over a long period of time in this state, the air pad may gradually wear out until becoming critical. In an extreme case, the air pad collides against the guide to make the stage inoperable. Hence, the air guide mechanism has drawbacks regarding long-term stability.

Japanese Patent Laid-Open No. 9-5463 discloses an example in which a stage base is made of an alumina ceramic material. As the alumina ceramic material is a non-magnetic body and cannot be magnetically pressurized, it is pressurized by a vacuum pad. In an arrangement using a pressurization pad as a vacuum pad, to generate an attracting force equal to that of a pressurization magnet, the pressurization pad must have a pad area larger than the area of the pressurization magnet. Also, a vacuum air line must be formed in addition to a pressure air line. This complicates mounting on the lower surface of a fine-movement stage which forms the pad as well as pipe mounting of the entire stage apparatus. In addition, to obtain an attracting force equal to that of the pressurization magnet, high-vacuum air is needed. Therefore, a high-vacuum air line must be connected to the exposure apparatus.

Japanese Patent Laid-Open No. 2000-260691 discloses an example in which a ceramic material is sprayed onto a stage base. When using a pressurization magnet, a thin ceramic layer must be formed. If the spray ceramic layer is formed thin, however, the rigidity of an air pad slide surface cannot be maintained. If the thicknesses of the magnet pressurization surface and air pad slide surface are to be changed, the number of steps of processing the ceramic layer must be increased, leading to degradation in accuracy and an increase in cost.

SUMMARY OF THE INVENTION

The present invention enables to provide a driving apparatus and exposure apparatus which improve the rigidity and durability of a guide while maintaining the moving performance of a movable body by, e.g., an improvement in the structure of the guide, and a device fabrication method.

According to a first aspect of the present invention, there is provided a driving apparatus including a movable body, a guide which guides and supports the movable body, and a driving unit which drives the movable body, wherein the guide includes a support which contains a magnetic material and includes a recess and a projection on a side that guides the movable body, and a brittle material layer which covers at least the recess of the support and includes a guide surface that guides the movable body, the movable body includes an air pad to cause the movable body to levitate from the guide surface, and a magnet to obtain an attracting force with respect to the support, and the projection of the support is formed along a driving direction of the movable body which is driven by the driving unit, and arranged to oppose the magnet.

According to a second aspect of the present invention, there is provided an exposure apparatus which projects a pattern of an original held by an original stage onto a substrate held by the substrate stage using a projection optical system and exposes the substrate, the apparatus comprising a driving apparatus including a movable body, a guide which guides and supports the movable body, and a driving unit which drives the movable body, wherein the guide includes a support which contains a magnetic material and includes a recess and a projection on a side that guides the movable body, and a brittle material layer which covers at least the recess of the support and includes a guide surface that guides the movable body, the movable body includes an air pad to cause the movable body to levitate from the guide surface, and a magnet to obtain an attracting force with respect to the support, the projection of the support is formed along a driving direction of the movable body which is driven by the driving unit, and arranged to oppose the magnet, and the driving apparatus is configured to drive at least one of the original stage and the substrate stage in response to movement of the movable body of the driving apparatus.

According to a third aspect of the present invention, there is provided a device fabrication method comprising steps of:

exposing a substrate using an exposure apparatus including an original stage and a substrate stage; and performing a development process for the substrate exposed, wherein the exposure apparatus includes a driving apparatus including a movable body, a guide which guides and supports the movable body, and a driving unit which drives the movable body, wherein the guide includes a support which contains a magnetic material and includes a recess and a projection on a side that guides the movable body, and a brittle material layer which covers at least the recess of the support and includes a guide surface that guides the movable body, wherein the movable body includes an air pad to cause the movable body to levitate from the guide surface, and a magnet to obtain an attracting force with respect to the support, wherein the projection of the support is formed along a driving direction of the movable body which is driven by the driving unit, and arranged to oppose the magnet, and wherein the driving apparatus is configured to drive at least one of the original stage and the substrate stage in response to movement of the movable body of the driving apparatus.

According to a fourth aspect of the present invention, there is provided a driving apparatus which drives a movable body supported by a guide, wherein the guide includes a support which is made of a magnetic material and includes unevenness on a side that guides the movable body, and a brittle material layer which covers the unevenness of the support and forms a guide surface that guides the movable body, and the movable body includes an air pad and a pressurization magnet so that the movable body levitates above the guide surface.

According to a fifth aspect of the present invention, there is provided an exposure apparatus which projects a pattern on an original held by an original stage onto a substrate held by a substrate stage using a projection optical system and exposes the substrate, the apparatus comprising a driving apparatus which drives a movable body supported by a guide, wherein the guide includes a support which is made of a magnetic material and includes unevenness on a side that guides the movable body, and a brittle material layer which covers the unevenness of the support and forms a guide surface that guides the movable body, the movable body includes an air pad and a pressurization magnet so that the movable body levitates above the guide surface, and the driving apparatus is configured to drive at least one of the original stage and the substrate stage in response to movement of the movable body of the driving apparatus.

According to a sixth aspect of the present invention, there is provided a device fabrication method comprising steps of: exposing a substrate using an exposure apparatus including an original stage and a substrate stage; and performing a development process for the substrate exposed, wherein the exposure apparatus includes a driving apparatus driving a movable body supported by a guide, wherein the guide includes a support which is made of a magnetic material and includes unevenness on a side that guides the movable body, and a brittle material layer which covers the unevenness of the support and forms a guide surface that guides the movable body, wherein the movable body includes an air pad and a pressurization magnet so that the movable body levitates above the guide surface, and wherein the driving apparatus is configured to drive at least one of the original stage and the substrate stage in response to movement of the movable body of the driving apparatus.

Further features of the present invention will be apparent from the following description of exemplary embodiments with reference to the attached drawings.

DESCRIPTION OF THE EMBODIMENTS

A preferred embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

This embodiment exemplifies a case in which a stage apparatus according to the present invention is applied to a substrate stage apparatus (wafer stage apparatus 17) in an exposure apparatus which holds a substrate.

Figure 1:
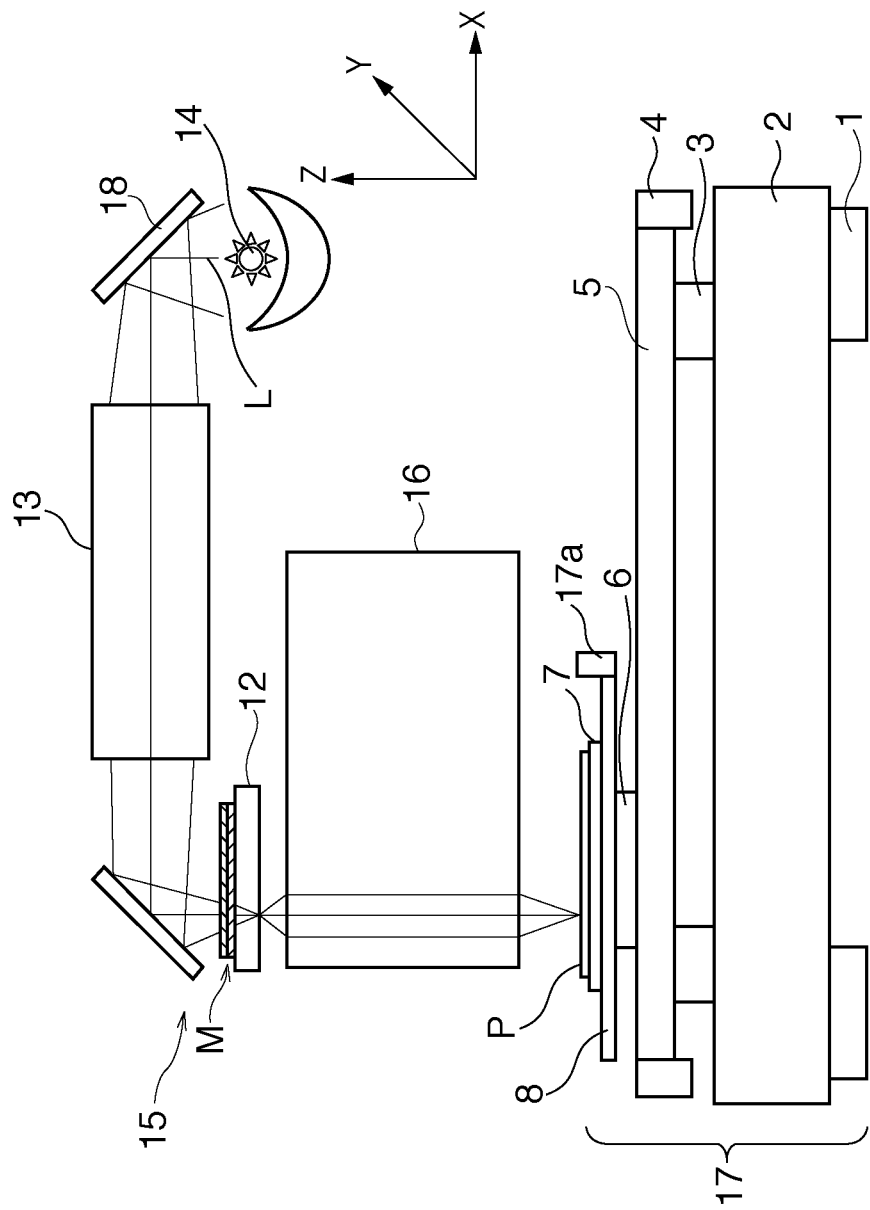
FIG. 1 is a view showing an example of the schematic arrangement of an exposure apparatus 15 according to an embodiment.

FIG. 1 is a view showing an example of the schematic arrangement of an exposure apparatus 15 according to this embodiment.

The exposure apparatus 15 has a function of projecting a pattern formed on a mask M onto a wafer P coated with a photosensitive agent to transfer the pattern onto the photosensitive agent on the wafer P. The exposure apparatus 15 comprises a light source 14, an illumination optical system 13, a mask stage apparatus 12, a projection optical system 16, the wafer stage apparatus 17, and the like. The Z-axis is set in a direction parallel to the optical axis of the projection optical system 16. Within a plane perpendicular to the optical axis of the projection optical system 16, the Y-axis is set in a direction perpendicular to the surface of the sheet of drawing of FIG. 1. Within the plane perpendicular to the optical axis of the projection optical system 16, the X-axis is set in a direction parallel to the surface of the sheet of drawing of FIG. 1.

The mask stage (to be referred to as an original stage as well) apparatus 12 serves to hold the mask (to be referred to as an original as well) M. The light source 14 generates a light beam L used to expose the wafer P. As the light source 14, for example, an excimer laser is suitable. The light beam L emitted by the light source 14 is reflected by a mirror 18 and provided to the illumination optical system 13. The illumination optical system 13 illuminates the mask M. The light beam L coming from the illuminated mask M forms an image on the wafer (to be referred to as a substrate as well) P through the projection optical system 16. The pattern image of the mask M is formed on the surface of the wafer P. When driving a wafer stage (to be referred to as a substrate stage as well) 8, the wafer P is stepped two-dimensionally. The respective shot regions of the wafer P are sequentially exposed while stepping the wafer P, thus transferring the pattern of the mask M onto the respective shot regions of the wafer P one after another.

The wafer stage 8 serves to hold the wafer P and is driven in orthogonal directions (X, Y, and Z three-dimensional directions). A moving mirror 17a is fixed on the wafer stage 8. The moving mirror 17a is used to detect the position of the wafer stage 8 (i.e., the wafer P) by a laser interferometer (not shown).

Figure 2:
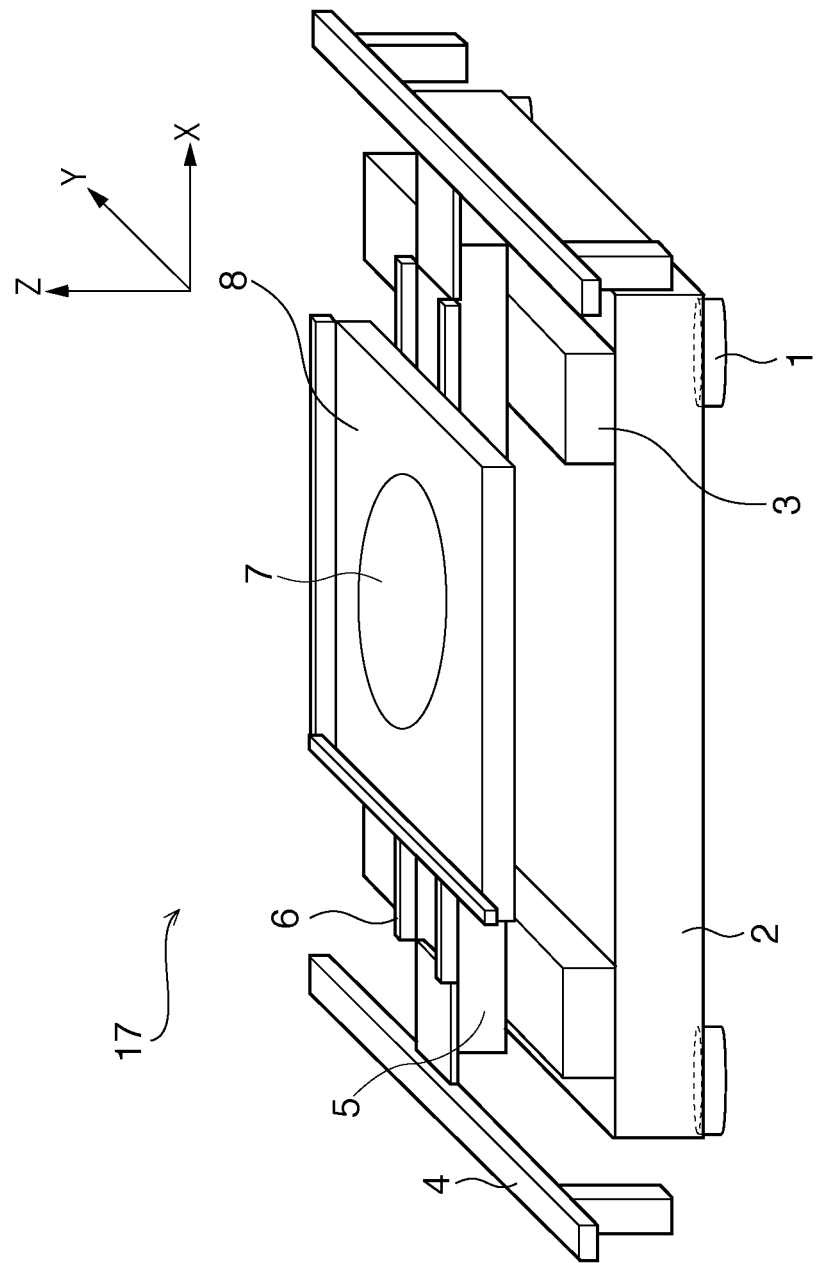
FIG. 2 is a view showing an example of the perspective appearance of a wafer stage apparatus 17 shown in FIG. 1.

FIG. 2 is a view showing an example of the perspective appearance of the wafer stage apparatus 17. The wafer stage apparatus 17 comprises damping devices 1, a base 2, Y guides 3, Y-driving linear motors 4, an X guide 5, an X-driving linear motor 6, a wafer chuck 7, and the like. The moving mirror 17a shown in FIG. 1 comprises a Y-moving mirror and X-moving mirror. The X- and Y-direction positions of the wafer stage 8 are detected by using the Y- and X-moving mirrors, respectively.

The damping devices 1 are arranged between the base 2 and the factory floor where the exposure apparatus 15 is installed. The damping devices 1 have pneumatic dampers, linear motors, or the like, damp the vibration acting on the base 2, and control a change in posture of the exposure apparatus 15 caused when the wafer stage 8 moves.

Figure 3:
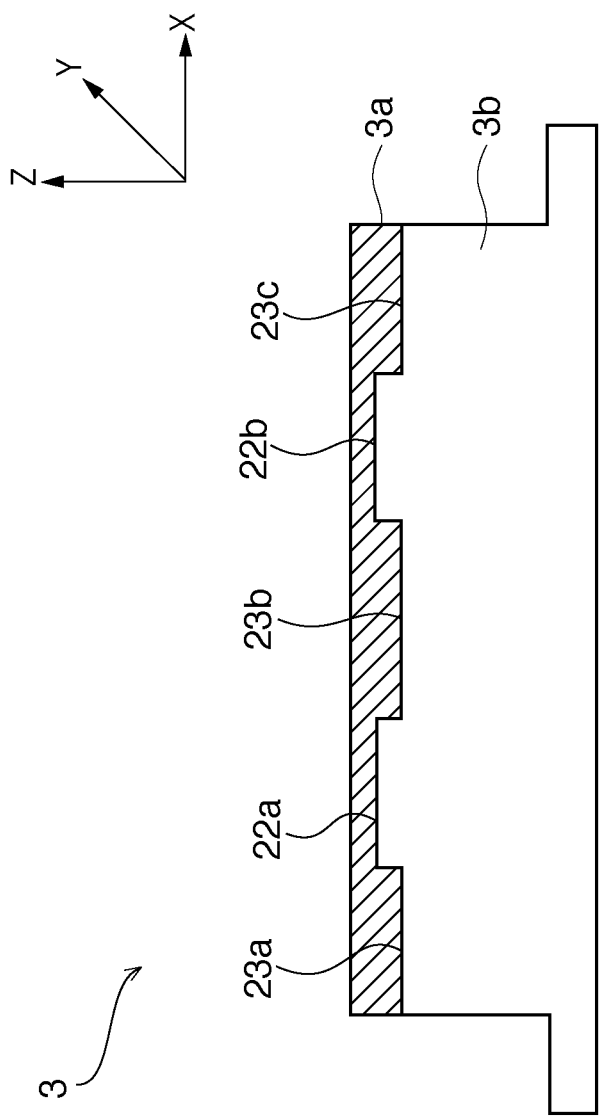
FIG. 3 is a view showing an example of the enlarged section of a Y guide 3 shown in FIG. 2.

FIG. 3 is a view showing an example of the enlarged section of the Y guide 3.

The Y guide 3 is configured to include a ceramic layer 3a as a brittle material and magnetically attracting metal layer 3b.

The magnetically attracting metal layer 3b is made of a magnetic material having magnetically attracting properties, e.g., a metal material, and constitutes the support of the Y guide 3. The magnetically attracting metal layer 3b is made of, e.g., a cast material with low thermal expansion coefficient, and has sufficient rigidity. The magnetically attracting metal layer 3b may employ a plate working structure. The magnetically attracting metal layer 3b has an uneven shape on a side where a movable body, i.e., the X guide 5 in this embodiment, moves as it is supported by the Y guide 3.

The magnetically attracting metal layer 3b has unevenness on its guide surface side that supports or guides the X guide 5. The ceramic layer 3a is formed on the metal layer 3b to cover it. The surface of the ceramic layer 3a serves as a guide surface that supports or guides the X guide 5. The ceramic layer 3a is made of, e.g., a sprayed ceramic material.

An air guide mechanism (not shown) levitates the X guide 5 at a predetermined height above the Y guides 3, and the Y-driving linear motors 4 move the X guide 5 in the Y direction freely. An air guide mechanism (not shown) levitates the wafer stage 8 at a predetermined height above the X guide 5. The stator of the X-driving linear motor 6 is fixed to the X guide 5, and the movable element of the X-driving linear motor 6 is fixed to the wafer stage 8. Such an X-driving linear motor 6 moves the wafer stage 8 in the X direction freely. More specifically, the two linear motors 4 and 6 move the X guide 5 and Y guides 3, and the wafer stage 8 is driven upon this movement.

An example of the procedure of fabricating the Y guide 3 in the wafer stage apparatus 17 having the above arrangement will be described with reference to FIGS. 4 to 7.

Figure 4:
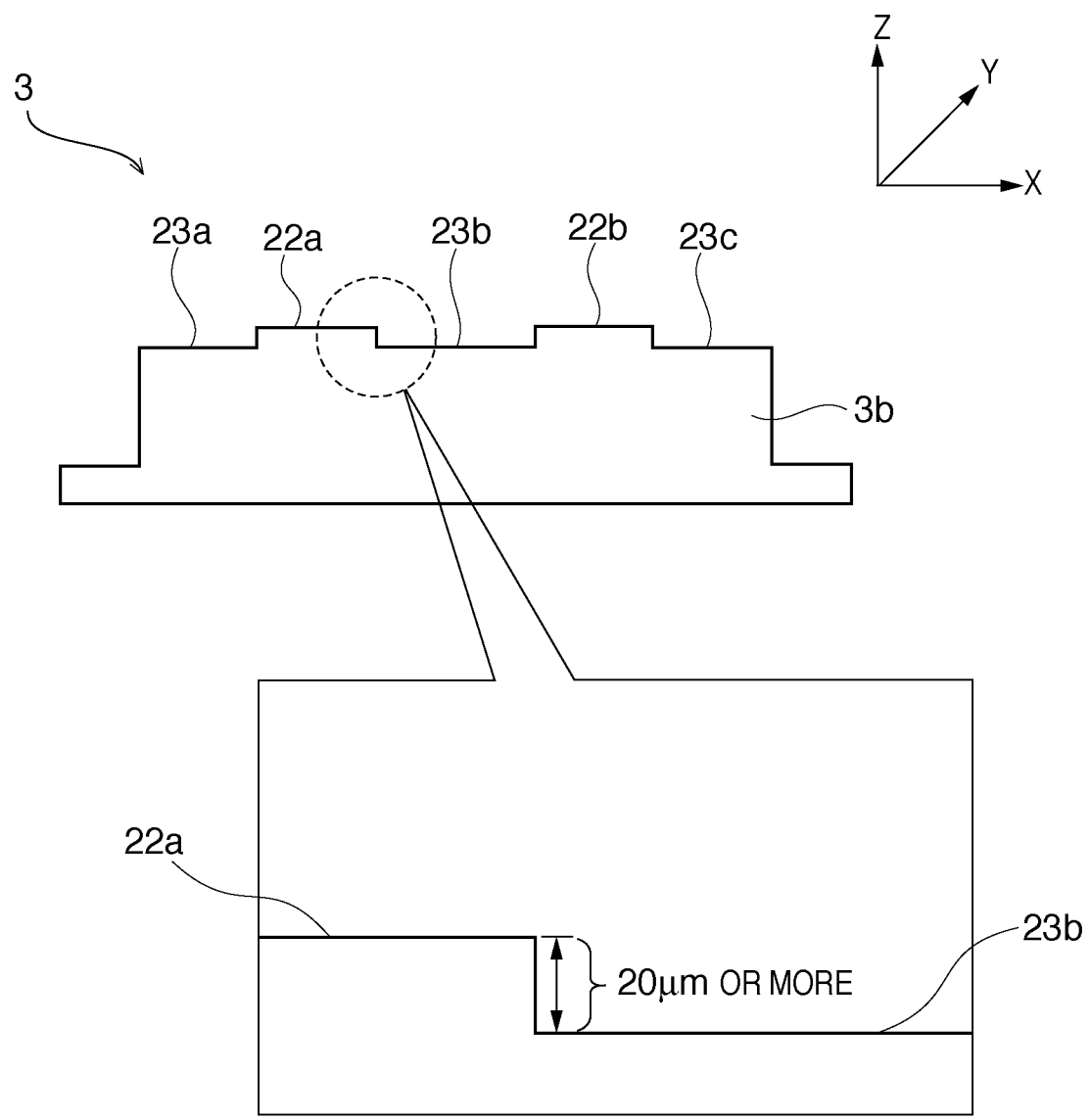
FIG. 4 is the first view showing an example of a procedure of fabricating the Y guide 3 shown in FIG. 2.

First, the magnetically attracting metal layer 3b of the Y guide 3 is formed. As shown in FIG. 4, an uneven shape having a surface including at least one set of high level and low level (to be referred to as a step difference hereinafter) is formed on the metal layer 3b. The step difference is, e.g., 20 μm or more. Depending on the apparatus arrangement, the step difference may be, e.g., 50 μm or more, or 100 μm or more. The uneven shape is formed to oppose a pressurization magnet and air pad, and its detail will be described later. If the step difference is large, the ceramic layer 3a which opposes the air pad can be formed thick by spraying. Hence, the rigidity and durability of the ceramic layer 3a can be improved.

Figure 5:
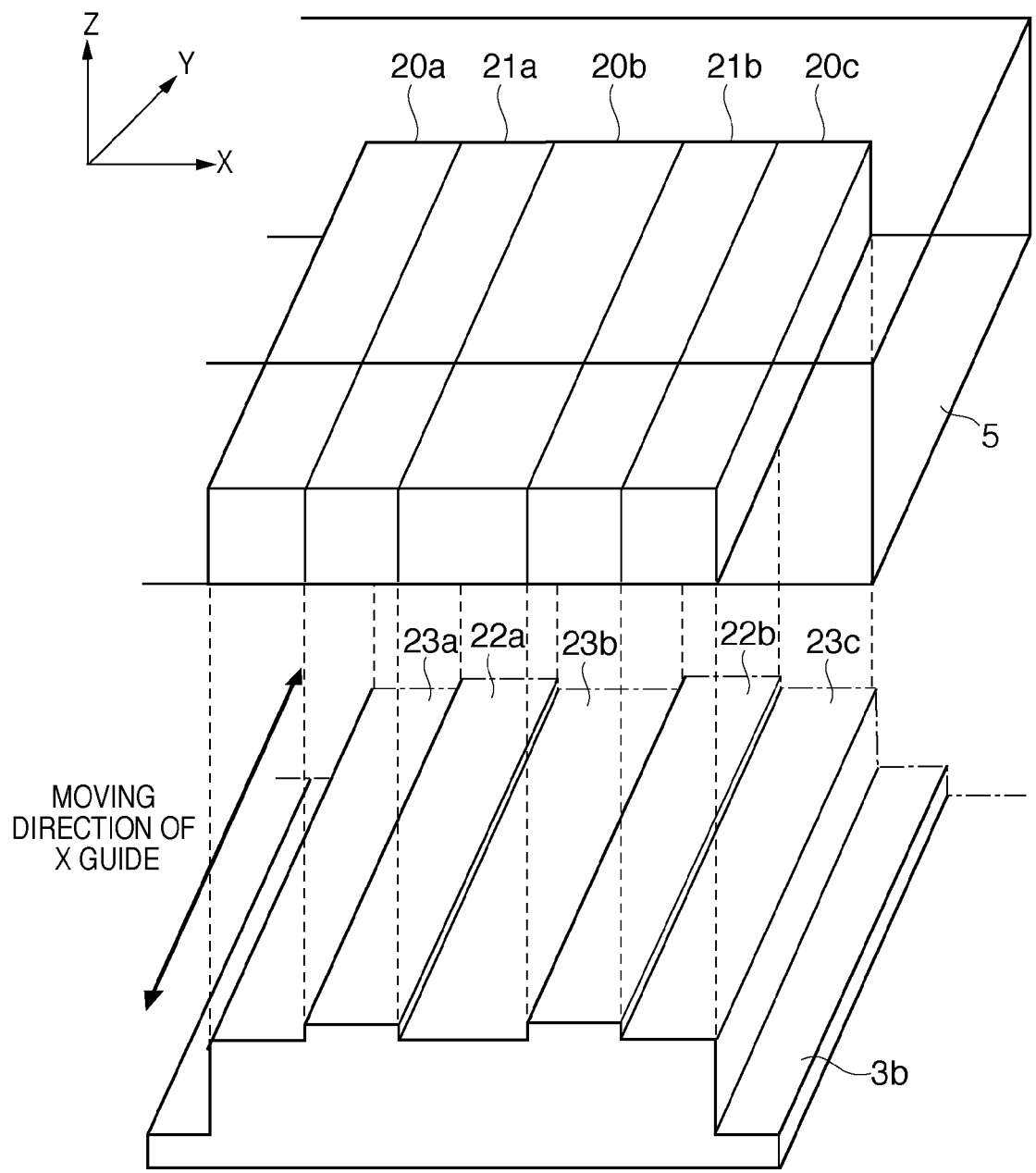
FIG. 5 is the second view showing the example of the procedure of fabricating the Y guide 3 shown in FIG. 2.

In the uneven shape formed on the metal layer 3b, a recess 23a, 23b, or 23c opposes the air pad 20a, 20b, or 20c of the X guide 5, as shown in FIG. 5. Furthermore, in this uneven shape, a projection 22a, or 22b opposes the pressurization magnet 21a, or 21b of the X guide 5. This arrangement is employed in order to decrease the thickness of the ceramic layer 3a at a position opposing the pressurization magnet 21a, or 21b, increase the thickness of the ceramic layer 3b at a position opposing the air pad 20a, 20b, or 20c, thereby improving the rigidity while reducing the attracting force of the magnet.

For example, each of the projection 22a, or 22b and recess 23a, 23b, or 23c of the uneven shape has a rectangular shape, and its longitudinal direction extends along the moving direction of the X guide 5. This arrangement is employed in order to maintain the levitation force of the air pad and the attracting force of the pressurization magnet, thereby moving the X guide 5 stably.

Figure 6:
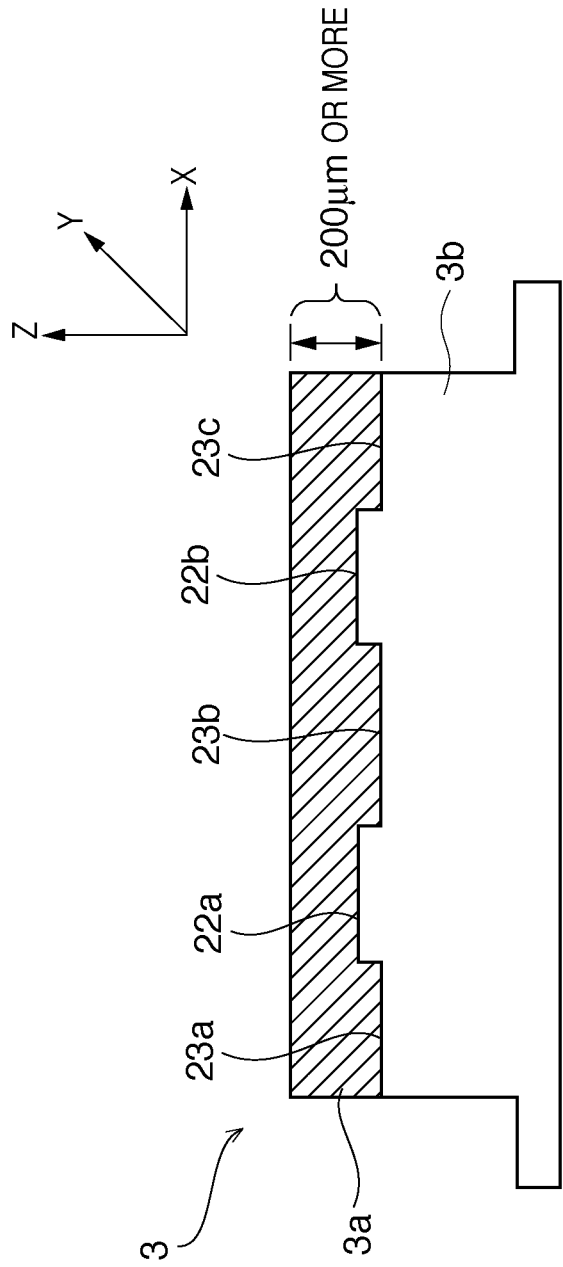
FIG. 6 is the third view showing the example of the procedure of fabricating the Y guide 3 shown in FIG. 2.
Figure 7:
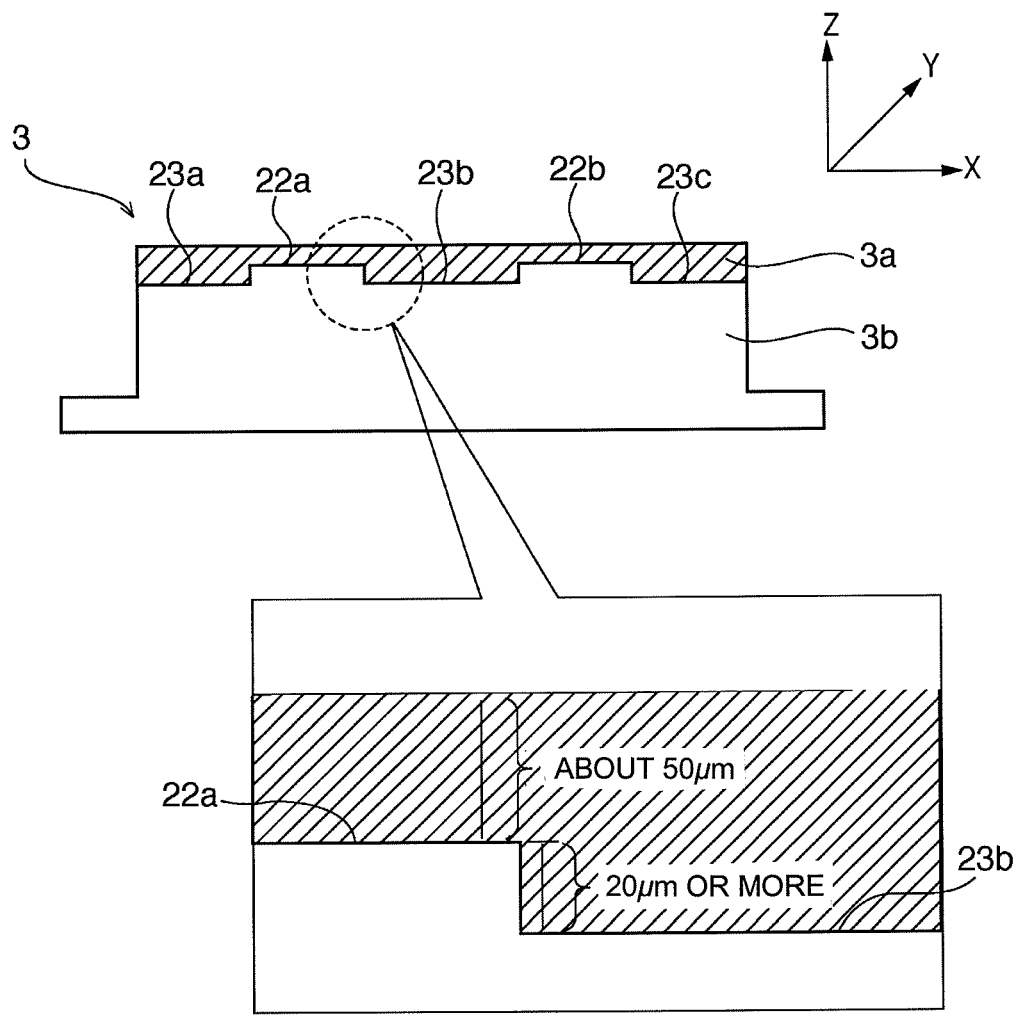
FIG. 7 is the fourth view showing the example of the procedure of fabricating the Y guide 3 shown in FIG. 2.

Subsequently, the ceramic layer 3a is formed on the metal layer 3b by spraying to cover the uneven shape. As shown in FIG. 6, the ceramic layer 3a is formed on the metal layer 3b for, e.g., 200 μm or more by spraying. After this spraying, pores of the ceramic layer 3a are sealed, and the surface of the ceramic layer 3a is polished to form an even surface. As shown in FIG. 7, surface polishing is performed such that the thickness of the ceramic layer 3a on the projection of the magnetically attracting metal layer 3b is about, e.g., 50 μl. When the guide surface on that side which supports the X guide 5 forms an even surface in this manner, the working time can be shortened and the cost can be suppressed. Also, the flatness accuracy can be improved. The surface here has the flatness not to impair the function as the guide and need not be a surface with perfect flatness.

According to this embodiment, the projections and recesses of the metal layer 3b are covered with the ceramic layer 3a. If the function as the guide is not impaired, it is possible to cover only the recesses with the ceramic layer 3a.

The ceramic is used to form the brittle material layer in this embodiment, but a material such as glass, diamond, composite carbon material, or stone is usable in place of the ceramic if the material has a certain hardness value (hardness of 7 or more is preferable) enough for practical use.

The purpose of the use of a brittle material layer on the surface of the metal layer is to prevent direct contact with a metal layer or air pad and prevent swelling caused by the contact of the metal with the air pad or the like. Materials usable as a brittle material layer are not limited to the ones described in the above embodiment without departing from the scope of the present invention.

The arrangement and fabrication procedure of the X guide 5 are identical to the arrangement and fabrication procedure of the Y guide 3 described with reference to FIGS. 3, 4 to 7, and a repetitive description will be omitted.

Although the fabrication procedure of the Y guide 3 is described with reference to FIGS. 4 to 7, it is merely an example. For example, although the projections are formed at two portions in the above example, a projection may naturally be formed at one portion, at each of three portions, or more.

In the above description, the arrangement and fabrication procedure of the X guide 5 and Y guides 3 in the wafer stage apparatus 17 are described. The arrangement of the X guide 5 and Y guides 3 in the wafer stage apparatus 17 can also be applied to the mask stage apparatus 12 described above. Furthermore, this arrangement need not always be applied to the wafer stage apparatus 17 but may be applied only to the mask stage apparatus 12. More specifically, the arrangement described above can be applied to at least one of the wafer stage apparatus 17 and mask stage apparatus 12. Naturally, this arrangement can be applied to any apparatus which is of a type similar to that of the wafer stage apparatus 17 or the like.

A device is fabricated by a step of exposing a substrate (a wafer, glass plate, or the like) coated with a photoresist (photosensitive agent) using the exposure apparatus 15, a step of developing the exposed substrate, and other known steps.

As has been described above, according to the embodiment described above, for example, if a ceramic material is used as a brittle material, since the ceramic layer is formed by spraying, limitations on the size which poses a restriction on use of an ordinary ceramic material are eliminated. Therefore, the exposure apparatus which will further increase in size in the future can also be dealt with appropriately. Since the ceramic material is used at, e.g., only a necessary portion, the cost of the material can be reduced largely.

Since the guide surface is formed of a brittle material (for example, a ceramic layer), even when it is damaged, it will not bulge. Even when dust is caught in the air guide mechanism, a bulge due to work hardening does not form on the guide surface. Thus, no rubbing occurs between the guide surface and air guide mechanism. Hence, the air guide mechanism is not damaged and can maintain its performance over a long period of time. If a ceramic material is used as a brittle material, since uneven working is performed before the ceramic layer is formed by spraying, the thickness of the ceramic layer can be changed in accordance with the intended purpose.

The present invention can be widely applied to an exposure apparatus for fabricating a liquid crystal display device or semiconductor, a thin film magnetic head, an image sensing element (CCD), an exposure apparatus for fabricating a mask used in a projection exposure apparatus, and the like.

Other than the above apparatuses, the present invention is utilized in an apparatus such as a length measurement unit which moves a work, as a work moving mechanism and work positioning mechanism.

According to the present invention, the rigidity and durability of the guide can be improved by improving the structure of the guide while maintaining the moving performance of the movable body.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A driving apparatus including a movable body, a guide which guides and supports said movable body, and a driving unit which drives said movable body,
wherein
said guide includes a support which contains a magnetic material and includes a recess and a projection on a side that guides said movable body, and a layer which covers at least said recess of said support and includes a guide surface that guides said movable body,
said movable body includes an air pad to cause said movable body to levitate from said guide surface, and a magnet to obtain an attracting force with respect to said support,
said projection of said support is formed along a driving direction of said movable body which is driven by said driving unit, and arranged to oppose said magnet,
a length of said projection in the driving direction is longer than a length of said projection in a direction perpendicular to the driving direction,
said projection extends continuously over a movable range of the movable body so that the magnet and the projection always oppose each other in the movable range, and
a material of said layer comprises ceramic, glass, diamond, composite carbon material, or stone.

2. The apparatus according to claim 1, wherein said recess of said support continuously extends over the movable range of the movable body so that the air pad and the recess always oppose each other in the movable range.

3. The apparatus according to claim 1, wherein said layer covers said recess and said projection of said support.

4. The apparatus according to claim 1, wherein a surface of said layer serving as said guide surface is even.

5. The apparatus according to claim 1, wherein a height difference between said recess and said projection is not less than 20 μm.

6. An exposure apparatus which projects a pattern of an original held by an original stage onto a substrate held by said substrate stage using a projection optical system and exposes the substrate, said apparatus comprising
a driving apparatus including a movable body, a guide which guides and supports said movable body, and a driving unit which drives said movable body,
wherein said guide includes a support which contains a magnetic material and includes a recess and a projection on a side that guides said movable body, and a layer which covers at least said recess of said support and includes a guide surface that guides said movable body,
said movable body includes an air pad to cause said movable body to levitate from said guide surface, and a magnet to obtain an attracting force with respect to said support,
said projection of said support is formed along a driving direction of said movable body which is driven by said driving unit, and arranged to oppose said magnet,
a length of said projection in the driving direction is longer than a length of said projection in a direction perpendicular to the driving direction,
said projection extends continuously over a movable range of the movable body so that the magnet and the projection always oppose each other in the movable range,
said driving apparatus is configured to drive at least one of said original stage and said substrate stage in response to movement of said movable body of said driving apparatus, and
a material of said layer comprises ceramic, glass, diamond, composite carbon material, or stone.

7. A device fabrication method comprising steps of:
exposing a substrate using an exposure apparatus including an original stage and a substrate stage; and
performing a development process for the substrate exposed,
wherein said exposure apparatus includes a driving apparatus including a movable body, a guide which guides and supports said movable body, and a driving unit which drives said movable body,
wherein said guide includes a support which contains a magnetic material and includes a recess and a projection on a side that guides said movable body, and a layer which covers at least said recess of said support and includes a guide surface that guides said movable body, wherein said movable body includes an air pad to cause said movable body to levitate from said guide surface, and a magnet to obtain an attracting force with respect to said support, wherein said projection of said support is formed along a driving direction of said movable body which is driven by said driving unit, and arranged to oppose said magnet, wherein said driving apparatus is configured to drive at least one of said original stage and said substrate stage in response to movement of said movable body of said driving apparatus, a length of said projection in the driving direction is longer than a length of said projection in a direction perpendicular to the driving direction, said projection extends continuously over a movable range of the movable body so that the magnet and the projection always oppose each other in the movable range, and a material of said layer comprises ceramic, glass, diamond, composite carbon material, or stone.

* * * * *